(12) United States Patent
Bronner et al.

(10) Patent No.: US 6,495,876 B1
(45) Date of Patent: Dec. 17, 2002

(54) DRAM STRAP: HYDROGEN ANNEALING FOR IMPROVED STRAP RESISTANCE IN HIGH DENSITY TRENCH DRAMS

(75) Inventors: Gary Bronner, Stormville, NY (US); Ramachandra Divakaruni, Somers, NY (US); Yoichi Takegawa, Wappinger Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 19 days.

(21) Appl. No.: 09/609,288

(22) Filed: Jun. 30, 2000

(51) Int. Cl.$^7$ .............................................. H01L 27/108
(52) U.S. Cl. .................... 257/305; 257/304; 257/311
(58) Field of Search .......................... 257/301, 303–305, 257/311; 438/243–249

(56) References Cited

U.S. PATENT DOCUMENTS

| | | |
|---|---|---|
| 5,362,575 A | 11/1994 | Trimble |
| 5,494,860 A | 2/1996 | McDevitt et al. |
| 5,508,541 A * | 4/1996 | Hieda .......................... 257/301 |
| 5,895,274 A | 4/1999 | Lane et al. |

FOREIGN PATENT DOCUMENTS

EP   0 987 754   * 3/2000
JP   2000-58774   * 2/2000

OTHER PUBLICATIONS

IBM Technical Disclosure Bulletin, T.V. Rajeevakumar, "Process Scheme to Make Shallow Trench Isolation Self–Aligned to the Storage Trench," vol. 33, No. 10A, pp. 260–262, Mar. 1991.

* cited by examiner

Primary Examiner—Eddie Lee
Assistant Examiner—Marcos D. Pizarro-Crespo
(74) Attorney, Agent, or Firm—Ira D. Blecker; McGinn & Gibb, PLLC

(57) ABSTRACT

A method and structure for a DRAM device which includes a trench within an insulator, a conductor within the trench, a transistor adjacent a first side of the trench, and a shallow trench isolation region formed within a top portion of the conductor on a second side of the trench, opposite the first side, wherein the top portion of the conductor has a curved shape at an edge of the shallow trench isolation region. The curved shape comprises a conductive strap and electrically connects the conductor and the single crystal where the transistor is formed, further comprising a collar oxide surrounding the top portion of the conductor, the collar oxide controlling a shape and location of the curved shape. The curved shape is formed by hydrogen annealing, and may be convex, or concave. The DRAM further comprising a collar oxide extending into the shallow trench isolation region on the second side.

15 Claims, 4 Drawing Sheets

DRAM STRAP: HYDROGEN ANNEALING FOR IMPROVED STRAP RESISTANCE IN HIGH DENSITY TRENCH DRAMS

BACKGROUND OF THE INVENTION

1. Field of the Invention

The present invention generally relates to formation of a low resistive strap with hydrogen annealing within a DRAM structure.

2. Description of the Related Art

Conventional processing of trench dynamic random access memory (DRAM) structures forms a buried strap during the formation of a deep trench to connect the conductor in the deep trench to an adjacent transistor. The strap resistance has been shown to be a significant bottleneck in trench DRAM characteristics. The primary reason for this is that the active area (AA) to deep trench (DT) overlay is limited (by tool capability) to about 45 nm. The conventional process causes the strap to be etched away around the trench in unwanted areas during the shallow trench isolation definition leaving a sliver of silicon along the trench sidewalls to contact to the deep trench portion below the STI. This contributes significantly to the strap resistance.

Various schemes have been proposed (sometimes with an oxide cap on top of the trench as by Radens et al., U.S. Ser. No. 09/272124, referred to as a 'Pedestal' STI) leaving the polysilicon in the trench untouched but etching only the silicon outside the trench or performing the strap recess after the active area (AA) etch with a 'Poly Planarized' STI etch. However, neither of these schemes work with a 'lip' or near surface strap which is deemed necessary to avoid a deep strap with poor array device performance.

It should also be noted that for deep trenches with high cell capacitance it is necessary to minimize the gap at the top of the trench. However, the conventional poly fill technology cannot fill perfectly vertical trenches. This constant tradeoff results quite often with voids in the top of the trench polysilicon which need to be healed to prevent them from opening up during shallow trench isolation etching.

Therefore, there is a need for a low resistance buried strap which is thicker and does not have trench voids. It is to be noted that rounding of the STI corners is preferable for good gate oxide integrity.

SUMMARY OF THE INVENTION

It is, therefore, an object of the present invention to provide a structure and method for a DRAM device which includes a trench within an insulator, a conductor within the trench, a transistor adjacent a first side of the trench, and a shallow trench isolation region formed within a top portion of the conductor on a second side of the trench, opposite the first side, wherein the top portion of the conductor has a curved shape at an edge of the shallow trench isolation region. The curved shape comprises a conductive strap and electrically connects the conductor and the transistor, further comprising a collar oxide surrounding the top portion of the conductor, the collar oxide controlling a shape and location of the curved shape. The curved shape is formed by hydrogen annealing, and may be convex, or concave. The DRAM further comprises a collar oxide extending into the shallow trench isolation region on the second side. A method of manufacturing a DRAM device includes depositing a conductor in a trench, removing a portion of the conductor to form a shallow trench isolation region, and reflowing the conductor to form a curve in the conductor adjacent the shallow trench isolation region. The reflowing comprises hydrogen annealing, the curve is convex, or concave. The reflowing increases the width of the conductive portion. The trench has a collar oxide to surround a top portion of the conductor whose removal is selective to the collar and leaves the collar oxide in place. The collar oxide contacts a shape and position of the curve, further comprising forming a transistor adjacent the trench, wherein the top portion of the conductor comprises a strap connecting the conductor to the transistor and the curve reduces the resistance of the strap.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF PREFERRED EMBODIMENTS OF THE INVENTION

Figure 3:
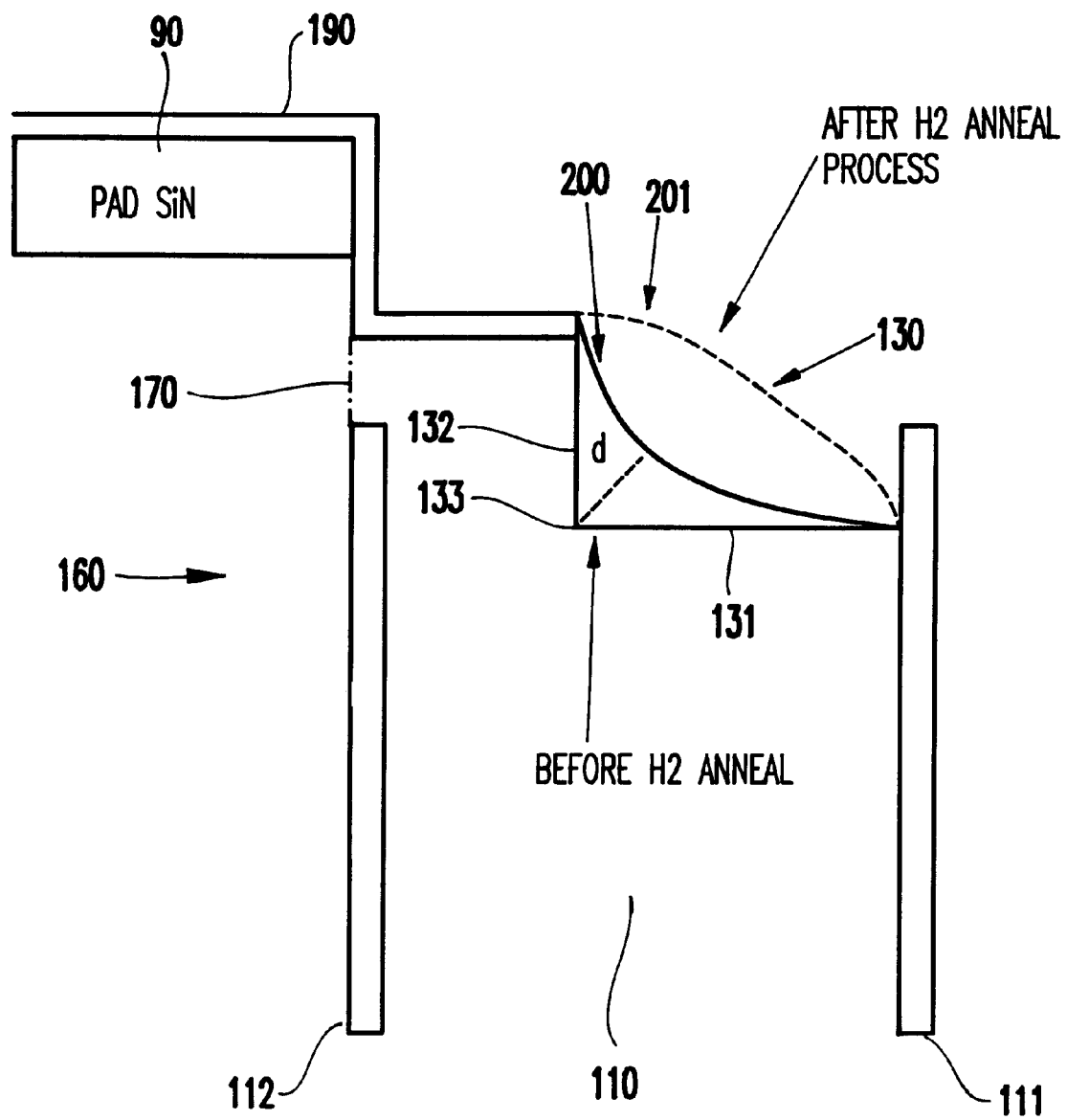
FIG. 3 is a schematic diagram similar to FIG. 1, but after hydrogen annealing; and, FIG. 4 is a schematic diagram similar to FIG. 1, but with disposable spacers.

The present invention is an improved DRAM structure and its method of manufacturing. The invention structure is shown in FIG. 3, which depicts a DRAM structure. More specifically, FIG. 3 illustrates a high capacitance deep trench filled with polysilicon or other similar conductive material 110 well known to those in the art. A shallow trench isolation (STI) area 130 intrudes into the top of the trench. A collar oxide 111, 112 is located adjacent the conductor 110, and one portion of the collar oxide 111 extends into the STI area 130. The conductor 110 extends above the other portion of the collar oxide 112 and abuts the STI area 130. Above this part of the collar oxide 112, the conductor 110 abuts silicon 160 on which the active device is built. The point where the conductor 110 and silicon 160 abut forms the lateral edge of a strap 170.

The surface of the trench DRAM structure at this stage of processing has the conventional features of a STI area 130 a transistor, and pads of silicon nitride 90 overlay the silicon 160. Also, a continuous layer of trench top silicon nitride (TT SiN) 190 may overlay the DRAM structure. However, unlike conventional trench DRAM structures, the STI area 130 does not form a corner 131–133, rather the conductor 10 structure has a curve 200 at the edge of the STI region 130. As shown in FIG. 3, the curve 200 is concave and may approximate the shape of a parabola. In other embodiments of the invention, the curve 200 may also be convex.

Figure 1:
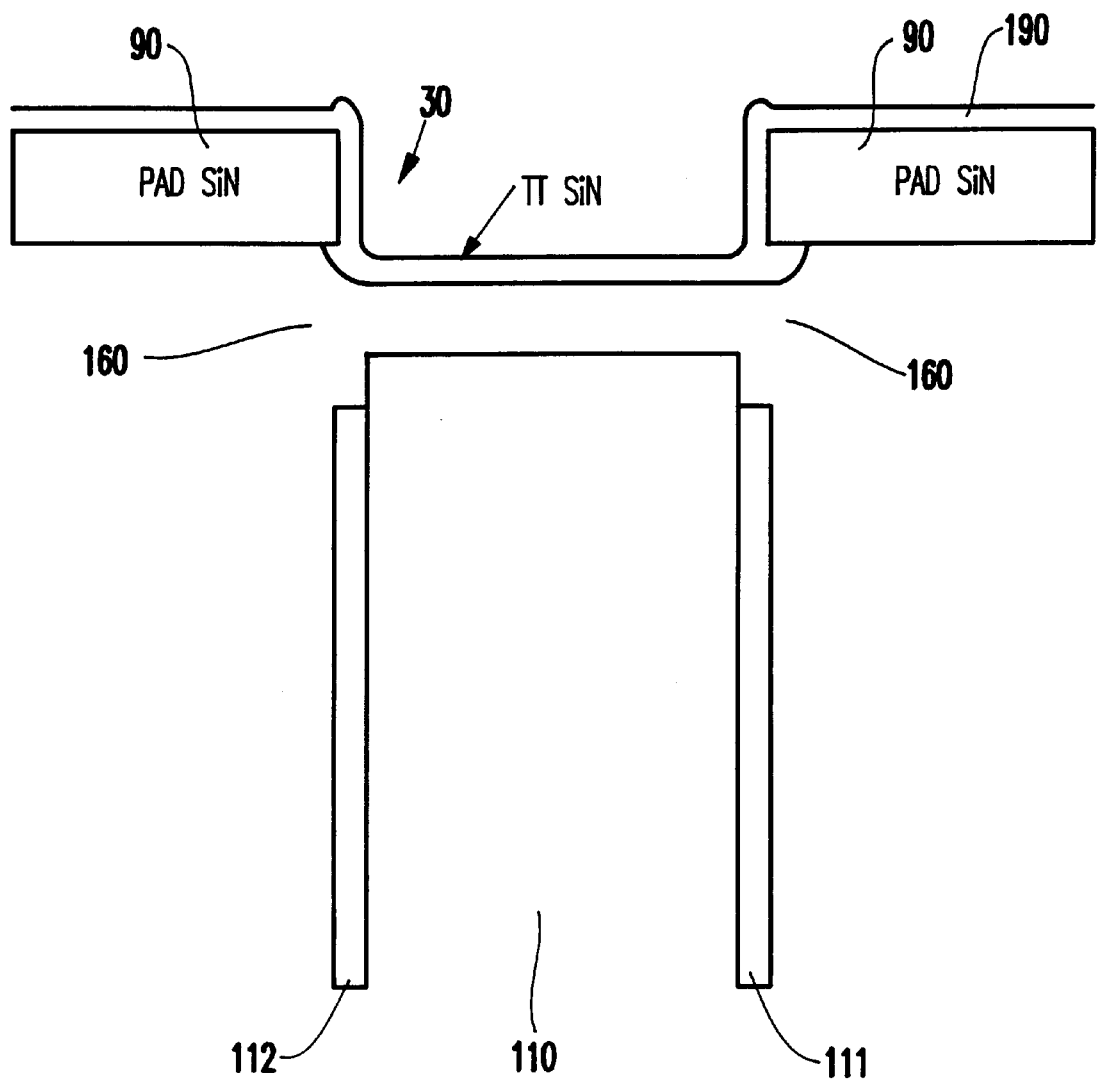
FIG. 1 is a schematic diagram of the top of the trench capacitor in a DRAM structure before the STI formation.
Figure 2:
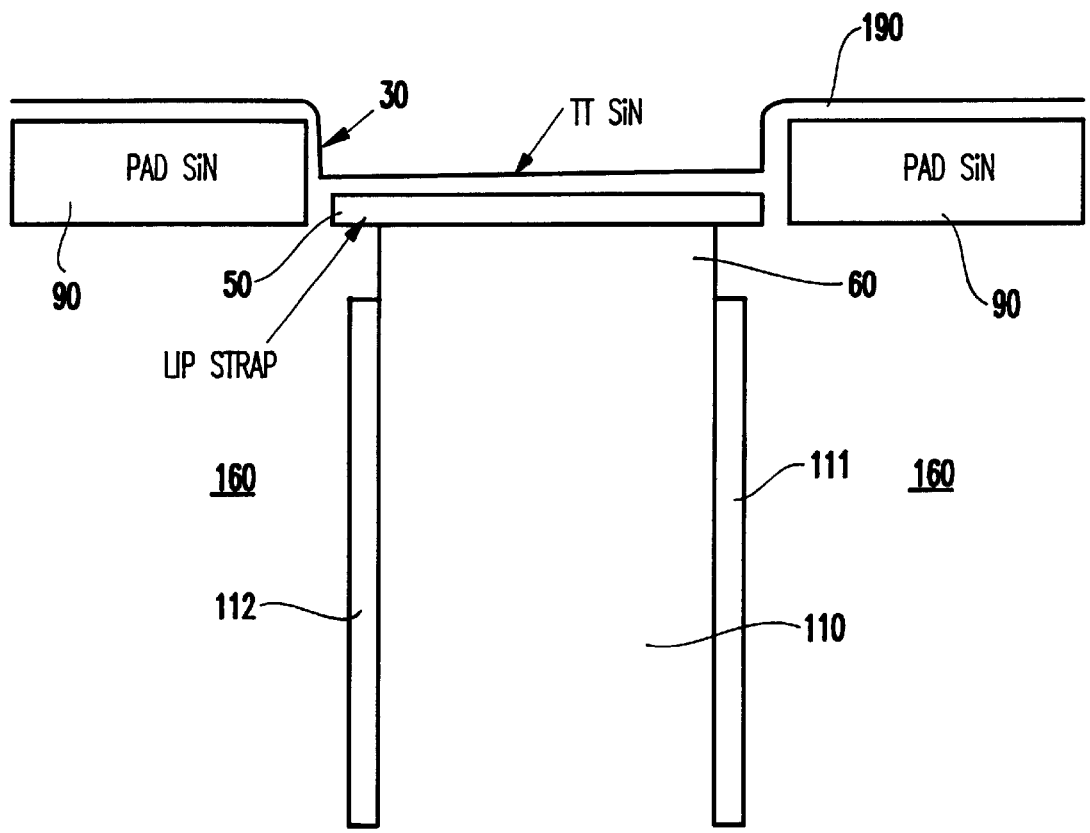
FIG. 2 is a schematic diagram similar to FIG. 1 but with the addition of a lip strap (LS)

The invention can be formed using the standard trench processing shown in FIGS. 1 and 2. FIG. 1 depicts a conductor 110 which contains a material such as polysilicon or other conductive compound well known to those skilled in the art. The conductor 110 is abutted by a collar oxide 111, 112 which is absent from the top most portion of the conductor 110. A trench 30 which is approximately the same width as conductor 110 overlays the conductor 110. The DRAM is formed in a semiconductor (e.g. mono-crystalline silicon) 160. Pad silicon nitride 90 covers the silicon 160.

Also, trench top (TT) silicon nitride 190 may be disposed over pad silicon nitride 90 and the trench 30. FIG. 2 differs from FIG. 1 in that a near surface or 'lip' strap 50 is formed on top of the conductor 110. The lip strap 50 is a separate conductor deposited at the very top of the conductor 110 and substantially improves the retention characteristics of the DRAM.

Using either the structures in FIG. 1 or 2, the invention then performs the following processes. A shallow trench isolation (STI) etch which is selective to oxide is performed. As shown in FIG. 3, the resultant structure is an STI recess 130 with a bottom surface 131 that abuts the side wall 132 at corner 133. Also, since the etch was selective to oxide, the side of the collar oxide 111 is not etched and protrudes through the recess 130 bottom surface 131. Also, note that a chemical downstream etch (CDE) (e.g., isotropic silicon etch) could be used to remove any silicon/poly 'stringers'.

A hydrogen annealing process is then applied to the STI recess 130. The annealing causes the conductor 110 to flow and move into the concave configuration 200 or convex configuration 201, as shown in FIG. 3. During annealing, the exposed portion of the collar oxide 111 acts as a dam to prevent the movement of the silicon 110 beyond collar oxide 111. After the annealing, the bottom surface 131, side wall 132 and corner 133 are replaced by the single curve 200 or 201. Depending on the temperature and other process conditions present during the annealing process the curve may be concave or convex. Typically, the reflow is carried out at about 950° C., 80 Torr pressure and is of the order of 50 seconds. This is followed by standard DRAM processing steps.

Figure 4:
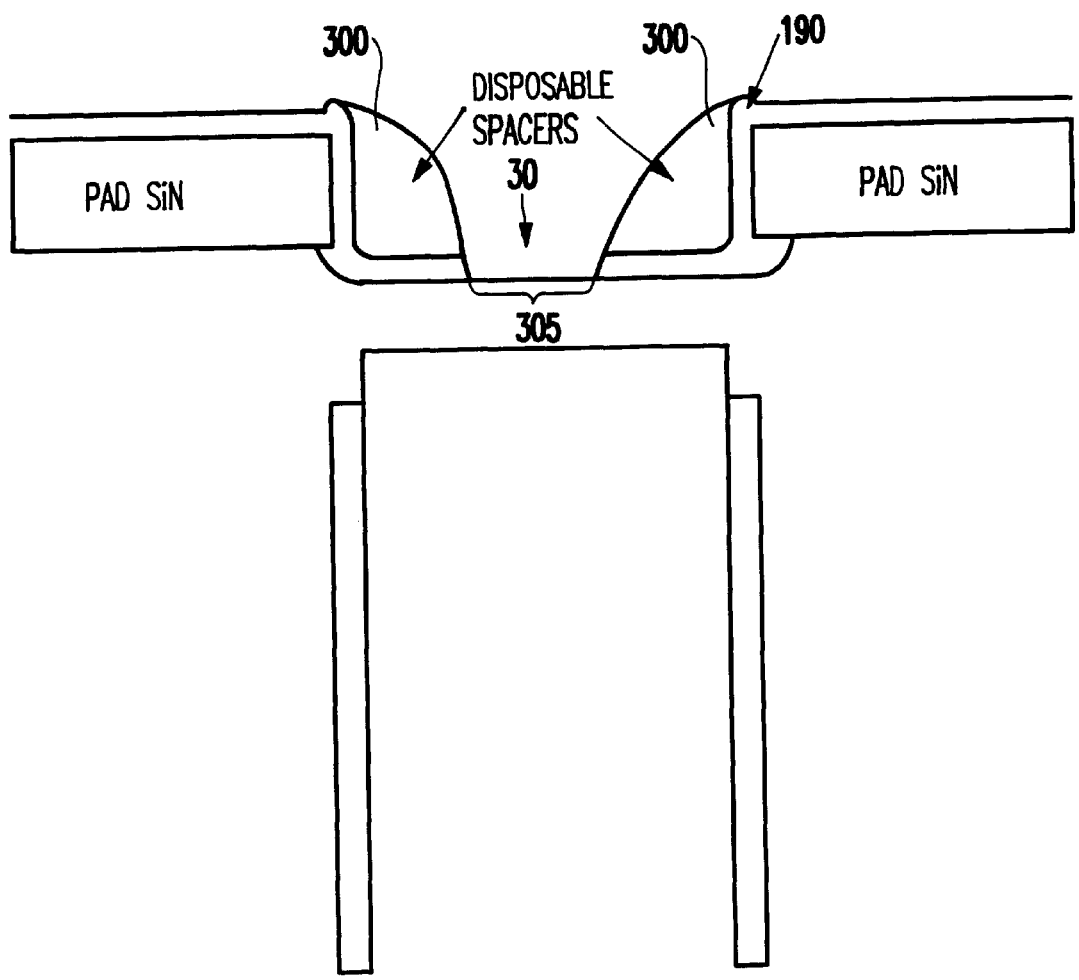

Another embodiment of the invention is shown in FIG. 4. This embodiment utilizes disposable spacers 300 on either side of the trench 30. The disposable oxide spacers allow for the TTN (190) to be etched a specific distance from the strap edge 170. This removes the dependence of AA to DT alignment on the definition of the edge of the TTN prior to $H_2$ annealing.

This embodiment is formed similar to the process described above, except that after the standard processing and the TT SiN 190 is deposited spacers 300 are formed in the trench 30. The spacers are formed by conventional deposition of an undoped or doped plasma or low pressure CVD oxides followed by a conventional anisotropic Reactive Ion Etch (RIE) of the oxide selective to the underlying TTN.

The spacers 300 may be made of doped glass or other suitable material well known to those skilled in the art. Next, an etching is performed such that the middle portion 305 of the doped glass is removed as shown in FIG. 4. The spacers allow independent control of the SiN on top of the trench (rather than just being defined by AA as in the embodiment above).

Next, the topography on the wafer is reduced. This is accomplished by reflowing the disposable spacer by rapid thermal annealing (RTA). The reflow causes the doped glass to fill part of the trench top area. Note that in this case the AA has to be etched up to the trench polysilicon before being converted to the oxide selective etch. The doped glass may be disposed off after the AA etch as is standard and by techniques well-known in the art (wet etchants like HF vapor and the like) or after the CDE 'clear up' if this is needed. The rest of the processing is as described in the first embodiment.

This invention provides a DRAM structure and method for manufacturing the DRAM structure which greatly reduces the resistance from the strap to the active devices on the silicon substrate. The resistance is reduced over the resistance associated with conventional straps because the strap of the invention is wider when connecting to the trench. The hydrogen annealing process eliminates the side wall 132 and bottom surface 131 and forms the curve 200, 201. The curve 200, 201 widens the strap from corner 133 a distance "d". The increased width of d allows the currents flow more readily from the strap to the active devices and thus, reduces strap resistance.

The invention also overcomes the difficulty of integrating the lip strap with the pedestal STI since the $H_2$ anneal ameliorates the dependence on overlay and a pedestal STI process is not necessary.

The trench voids which open in the conductor during the STI etch are eliminated during the inventive hydrogen annealing because the conductor is reformed within the STI region. Also, the poor gate oxide reliability that results from the sharp corners in the STI area is reduced with the invention. This is accomplished by the hydrogen annealing of the silicon which rounds the silicon corners of the STI region.

While the invention has been described in terms of preferred embodiments, those skilled in the art will recognize that the invention can be practiced with modification within the spirit and scope of the appended claims.

What is claimed is:

1. A dynamic random access memory device comprising:
   a trench within an insulator;
   a conductor within said trench; and
   a shallow trench isolation region formed within a top portion of said conductor, said shallow trench isolation region having a first side opposite a second side,
   wherein said top portion of said conductor has a curved shape at an edge of said shallow trench isolation region and said curved shape extends from said first side to said second side, and
   wherein said curved shape is concave.

2. The dynamic random access memory device of claim 1, further comprising a conductive strap electrically connecting said conductor to a transistor.

3. The dynamic random access memory device of claim 1, further comprising a collar oxide surrounding said top portion of said conductor, said collar oxide controlling the shape and location of said curved shape.

4. The dynamic random access memory device of claim 1, wherein said curved shape is formed by hydrogen annealing.

5. The dynamic random access memory device of claim 1, further comprising a collar oxide extending into said shallow trench isolation region.

6. A dynamic random access memory device comprising:
   a trench within an insulator;
   a conductor within said trench;
   a transistor adjacent to a first side of said trench; and
   a shallow trench isolation region formed within a top portion of said conductor on a second side of said trench, opposite said first side,
   wherein said top portion of said conductor has a curved shape at an edge of said shallow trench isolation region, and
   wherein said curved shape is concave.

7. The dynamic random access memory device of claim 6, further comprising a conductive strap electrically connecting said conductor and said transistor.

8. The dynamic random access memory device of claim 6, further comprising a collar oxide surrounding said top portion of said conductor, said collar oxide controlling the shape and location of said curved shape.

9. The dynamic random access memory device of claim 6, wherein said curved shape is formed by hydrogen annealing.

10. The dynamic random access memory device of claim 6, further comprising a collar oxide extending into said shallow trench Isolation region on said second side.

11. A dynamic random access memory device comprising;
 a trench wthin an insulator;
 a conductor within said trench, wherein said conductor has a top surface having a horizontal first portion and a second portion;
 a shallow trench isolation region along said second portion of said top surface of said conductor; and
 trench top silicon nitride layer on said horizontal first portion of said top surface of said conductor,
 wherein said second portion of said top surface of said conductor has a curved shape, wherein said curved shape is concave.

12. The dynamic random access memory device of claim 11, further comprising a conductive strap electrically connecting said conductor to a transistor.

13. The dynamic random access memory device of claim 11, further comprising a collar oxide adjacent to said second portion of said top surface of said conductor, said collar oxide controlling the shape and location of said curved shape.

14. The dynamic random access memory device of claim 11, wherein said curved shape is formed by hydrogen annealing.

15. The dynamic random access memory device of claim 11, further comprising a collar oxide extending into said shallow trench isolation region.

\* \* \* \* \*